(12) United States Patent
Yokoyama

(10) Patent No.: US 7,975,198 B2
(45) Date of Patent: Jul. 5, 2011

(54) TEST SYSTEM AND BACK ANNOTATION METHOD

(75) Inventor: Masaru Yokoyama, Tokyo (JP)

(73) Assignee: Advantest Corporation, Tokyo (JP)

( * ) Notice: Subject to any disclaimer, the term of this patent is extended or adjusted under 35 U.S.C. 154(b) by 281 days.

(21) Appl. No.: 12/407,202

(22) Filed: Mar. 19, 2009

(65) Prior Publication Data

US 2009/0240989 A1    Sep. 24, 2009

(30) Foreign Application Priority Data

Mar. 19, 2008 (JP) ................................. 2008-072401

(51) Int. Cl.
*G01R 31/28* (2006.01)
(52) U.S. Cl. .............. 714/741; 714/33; 714/37; 714/38; 714/702; 714/724; 714/738; 703/13; 703/22; 703/27; 703/28; 703/4; 716/132; 716/136
(58) Field of Classification Search ........................ None
See application file for complete search history.

(56) References Cited

U.S. PATENT DOCUMENTS

| | | | | |
|---|---|---|---|---|
| 7,069,526 | B2 * | 6/2006 | Schubert et al. | 716/102 |
| 7,209,851 | B2 * | 4/2007 | Singh et al. | 702/119 |
| 7,437,614 | B2 * | 10/2008 | Haswell et al. | 714/38 |
| 7,694,249 | B2 * | 4/2010 | Hamilton et al. | 716/136 |
| 2002/0046364 | A1 * | 4/2002 | Yoshimura | 714/38 |
| 2009/0119542 | A1 * | 5/2009 | Nagashima et al. | 714/33 |

* cited by examiner

*Primary Examiner* — John P Trimmings
(74) *Attorney, Agent, or Firm* — Osha • Liang LLP

(57) ABSTRACT

A test system for performing a test of a device is provided that comprises a source file of a test plan that describes a program for performing a test, and one or more of elements that are formed in a unit that divides the source file into one or more blocks. The test system further comprises an annotatable object that, when debugging of objects of the source file is performed, manages modification details of the debugging with reference to an element corresponding to a portion where the debugging is performed, and a controller that, after the debugging, rewrites the source file with details after the debugging is performed on an element basis based on the element and the annotatable object.

7 Claims, 6 Drawing Sheets

(A)

DUTType CPU_X;

Comment 1 preceded by and followed by blank line

Comment 2
Comment 3 followed by blank line

SpecificationSet Foo(min, max, typ)
{
    # Comment 4
    Voltage V = 1.0, # Interior Comment 1
               2.0, # Interior Comment 2
               1.5;
    Current C = 1.0 mA, 2.0 mA, 1.5 mA;

Comment 5
}

(B)

TEST SYSTEM AND BACK ANNOTATION METHOD

BACKGROUND

1. Technical Field

The present invention relates to a technical field of automatic test equipment. Particularly, the present invention relates to a back annotation processing technology for debugging a test program in automatic test equipment.

2. Related Art

In the past, since automatic test equipment (hereinafter referred to as "ATE") was provided with different specifications of each ATE manufacturer, configuration flexibility of pin configuration, a measuring unit, etc. were low, and it was difficult to reuse test program assets. Because of a background like this, open architecture ATE having a standardized interface is proposed so as to realize scalable and flexible ATE whose system can be changed to an optimum configuration according to functionality of a device.

For example, OPENSTAR® is one of such open architecture ATC standards (see "Semiconductor Test Consortium" available online at the Internet URL http://www.semitest.org/jp/home, which is searched on Mar. 19, 2008). The T2000 test system is a test system that adopted open architecture of the OPENSTAR standard. In this T2000 test system, a program for a device test is written as classes of C++ language (this test program is hereinafter referred to as a "test plan").

When debugging a user-created test plan, it is common that the test plan is loaded into automatic test equipment and debugged using a GUI tool, etc. However, when debugging is performed using a tool, such debugging is performed against test plan objects, thus debugged details are not automatically reflected in an original source file. Therefore, in order to reflect modification details in a source file, a user himself has to modify the source, which is cumbersome.

Also, although it is possible to obtain a modified source file by recompiling debugged objects, details that are written in an original source file are not retained in this case, causing a problem that a comment, etc. that a user wrote are deleted.

The present invention has been made in view of such circumstances, and it is an object of the present invention to provide a test system comprising a back annotation processing function that is capable of automatically reflecting modified details in an original source file when, for example, a test plan is debugged using a GUI tool, etc.

SUMMARY

In order to address the above problems, a test system of the present invention is a test system for performing a test of a device, the test system comprising: a source file of a test plan that describes a program for performing a test; one or more elements that are formed in a unit that divides the source file into one or more blocks; an annotatable object that, when debugging of objects of the source file is performed, manages modification details of the debugging with reference to an element corresponding to a portion where the debugging is performed; and a controller that, after debugging, rewrites the source file with details after the debugging is performed on an element basis based on the element and the annotatable object.

Preferably, the test plan comprises one or more source files, and one or more elements are formed for each of the one or more source files. It is also preferable to comprise source file information that is associated with each file name of the one or more source files and manages a series of elements that correspond to that source file.

Also preferably, separation of a block which is a unit in which the one or more elements are formed is determined based on a delimiter written in a source file. Also, debugging is preferably performed using a GUI tool.

Also, a back annotation method of the present invention is a method for reflecting modification details of debugging in an original source file in a test system for performing a test of a device. A controller of the test system comprises the steps of: loading a source file of a test plan that describes a program for performing a test; forming, after loading, one or more elements in a unit that divides the source file into one or more blocks; managing, when debugging of objects of the source file is performed, modification details of the debugging with an annotatable object that is associated with an element corresponding to a portion where the debugging is performed; and rewriting, after debugging, the source file with details after the debugging is performed on an element basis based on the element and the annotatable object.

A program of the present invention is characterized in that it makes a computer perform each of the processing steps of a back annotation method of the present invention. The program of the present invention can be installed in or loaded into a computer by using various recording media such as an optical disk such as a CD-ROM, a magnetic disc and a semiconductor memory, or downloading via a communication network, etc.

According to the present invention, a test system can be provided that comprises a back annotation processing function that can automatically reflect modification details in an original source file when, for example, a test plan is debugged using a tool, etc. Also, according to the present invention, since only a portion of a source file that is modified by debugging can be rewritten, there is a special effect that a comment written in an original source file is basically retained in a source file obtained after modification.

DESCRIPTION OF EXEMPLARY EMBODIMENTS

Embodiments of the present invention will now be described in detail. Like numerals depict like elements to avoid duplication of explanation. Also, the following embodiments are exemplification for describing the present invention and not intended to limit the present invention to only those embodiments. Furthermore, the present invention can be modified and applied in various ways as long as not departing from the gist thereof.

Figure 1:
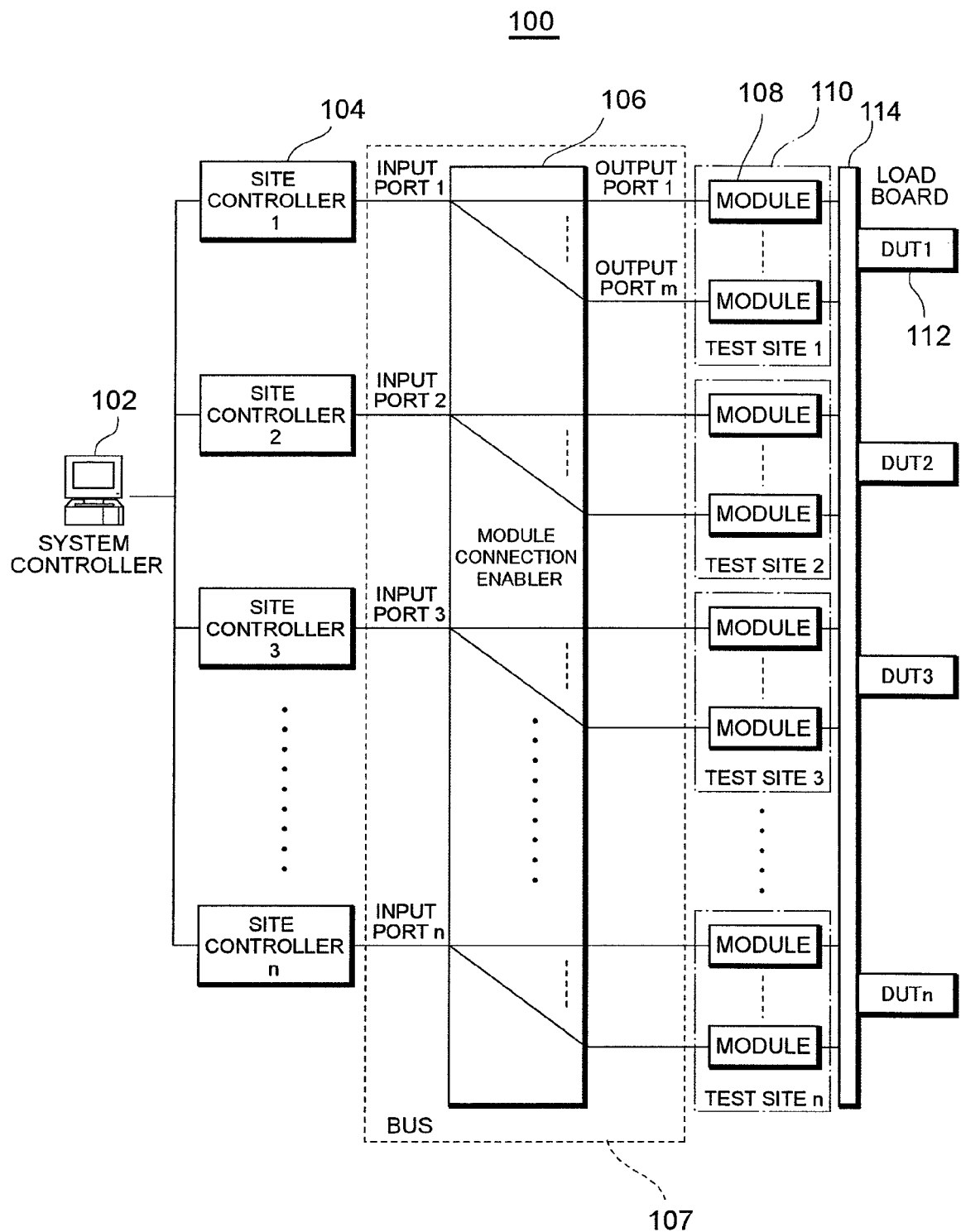
FIG. 1 is a diagram showing system architecture of a test system 100 in accordance with one embodiment of the present invention.

FIG. 1 shows system architecture of a test system 100 in accordance with one embodiment of the present invention. The test system 100 generates and supplies a test signal to a device under test (hereinafter referred to as "DUT") 112, and judges the quality of the DUT 112 based on whether or not a result signal that the DUT 112 outputs as a result of operation based on the test signal matches an expected value. Although the test system 100 of the present invention is described as the one that is realized by open architecture, the present invention is not limited to a test system having open architecture.

In the present embodiment, a system controller (SysC) 102 is connected to a plurality of site controllers (SiteC) 104 via a network. The system controller 102 is a host computer on which an end user usually performs operations, and plays a role of managing the whole test system 100. Also, the system controller 102 issues a processing request to the site controllers 104 and mediates processing between the site controllers 104. A user application and a standard GUI tool operate on the system controller 102 and communicate with the site controllers 104 to realize functions.

Also, the system controller 102 comprises a storage in which module software that controls a module 108 on the site controller 104 and user's test program and pattern program are stored. They are sent to the site controller 104 and run as needed.

Each site controller 104 is connected to the module 108 via a module connection enabler 106 for controlling one or more modules 108 disposed on a test site 110 to perform a test. This test is performed based on a test program that a user creates. The site controller 104 may simultaneously control a plurality of the test sites 110 each of which tests one DUT 112.

As major roles of the site controller 104, the following three can be sited. First, according to a configuration of the test site 110 designated by a test program, the site controller 104 configures the module connection enabler 106, and establishes connections of a bus 107 between the site controller 104 and the module 108. Also, the site controller 104 runs module software that controls the module 108 in the test site 110. Furthermore, the site controller 104 runs the test program and performs a test of the DUT 112 of each test site 110.

Depend on an operation environment, the system controller 102 may be deployed on a CPU (central processing unit) which is separated from the operation of the site controller 104. Alternatively, the system controller 102 and the site controller 104 may share a common CPU. Similarly, each site controller 104 may be deployed on its own dedicated CPU, or as a separate process or thread within the same CPU.

The module connection enabler 106 is a switch that can arbitrarily configure connections between the bus 107 and the site controller 104 and the module 108. The module connection enabler 106 enables a configuration of the connected hardware module 108 to be changed as well as plays a role of a bus for transferring data (for loading pattern data, collecting response data, performing control, etc.). Feasible implementation forms of hardware include a dedicated connection, a switched connection, a bus connection, a ring connection and a star connection. The module connection enabler 106 can be implemented as a switch matrix, for example.

The module 108 is hardware of a measuring instrument that supplies a test signal to the DUT 112. In the present embodiment, as the module 108, a module of various kinds that is based on open architecture can be used. Also, software for operating the module hardware 108 is called module software. The module software includes a module driver that is in charge of controlling the module 108 when a device is measured, corrective diagnosis software that performs correction and diagnosis of the module 108, emulation software that emulates the operation of the module 108 in software, a pattern compiler specific to the module 108, and a GUI tool, etc.

Each test site 110 is associated with one DUT 112. The DUT 112 is connected to the module 108 of the corresponding test site 110 via a load board 114.

Figure 2:
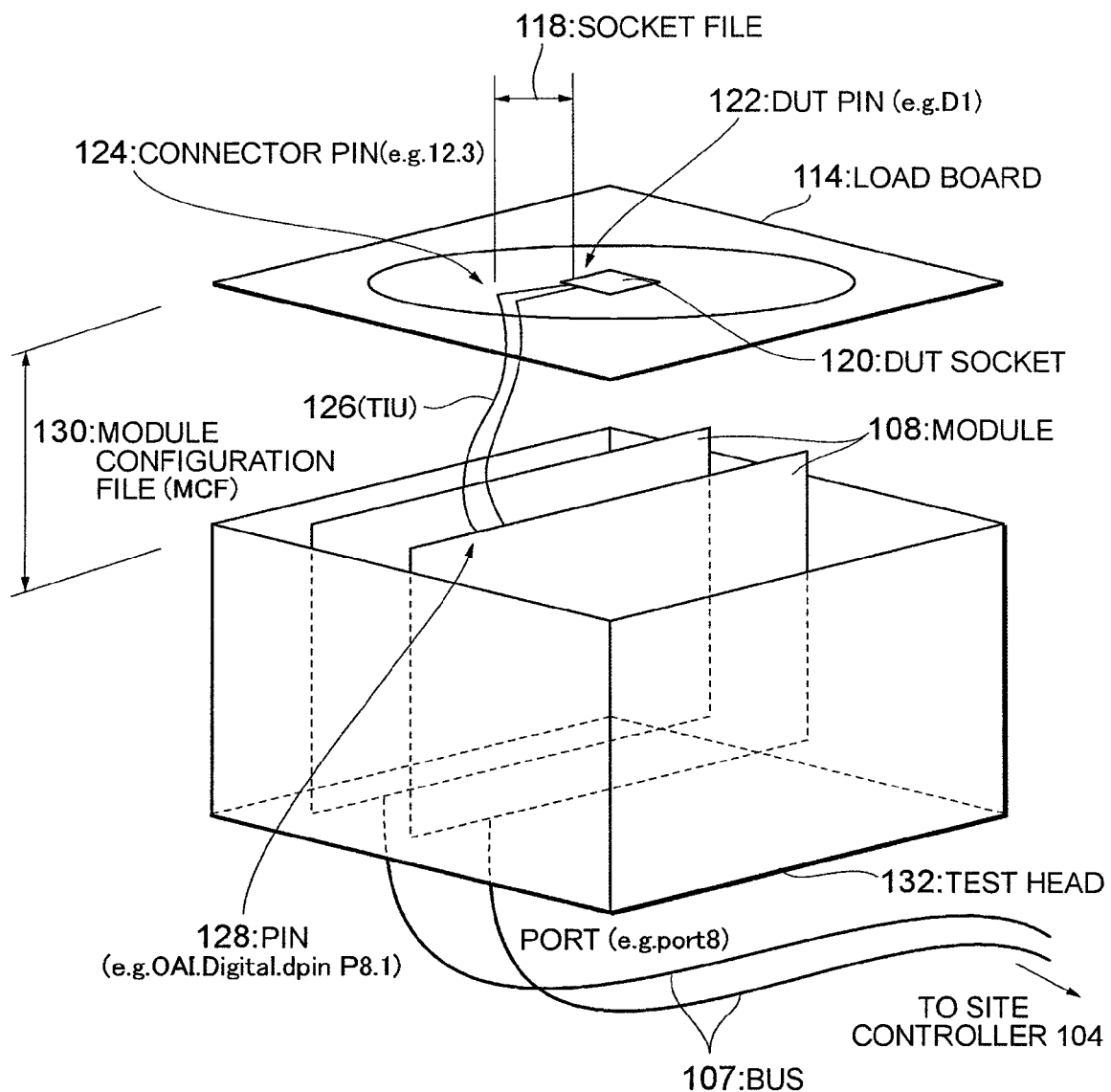
FIG. 2 is a diagram showing one example of a relationship between a schematic configuration of hardware of a test site 110 and a load board 114 and various configuration files.

FIG. 2 is a diagram showing one example of a relationship between a schematic configuration of hardware of the test site 110 and the load board 114 and various configuration files. As shown in FIG. 2, the module 108 is inserted into a module slot within a test head 132 of the test system 100.

A configuration of the test site 110 is designated in a socket file 118 written in a text format. In this socket file 118, a connection between a DUT pin 122 of a DUT socket 120 and a connector pin 124 on a load board 114 is described for each DUT 112. The connector pin 124 is assigned a block number and a connector number and represented in a form of "<block number>.<connector number>", such as "12.3". The connector pin 124 of the load board 114 is connected to a pin 128 of the module 108 via a tester interface unit (hereinafter referred to as a "TIU") 126.

On the other hand, the load board 114 often varies according to a device to be tested. Thus, in order to prevent module software from depending on an implementation of each load board 114, it is necessary, in the test system 100, to enable the pin 128 itself implemented by the module 108 to be defined and, based on that, the module 108 to be controlled. In the present test system 100, this is achieved by a module configuration file (hereinafter referred to as a "MCF") 130.

In the MCF 130, a connection relationship between a resource of the module 108 and the connector pin 124 of the load board 114 is specified. This defines a relationship between the resource which is a representation of a logical pin and the physical pin 128 of the module 128, and even the connector pin 124 of the load board 114 to which the physical pin 128 is connected. It is preferable that the MCF 130 can be configured only by the system.

In the present embodiment, the functionality of the module 108 is mainly represented by module objects that provide the functionality related to overall control of the module 108 and resource objects that provide the functionality of each pin of the module. In the test system 100 of the present embodiment, all of these are symmetrically associated with entities of the actual hardware according to the details described in the MCF 130. Module software that provides these software objects is called herein a module driver.

Also, in the present embodiment, a resource is something that represents the physical pin 128 and functionality thereof that the module 108 of the system 100 comprises by abstracting them by objects. One physical pin 128 of the module 108 may be represented as one resource, or a plurality of resources that are functionally divided.

A functional category of the resource is called a resource type, and definition of the functionality thereof is indicated by a resource definition file provided by a vendor of the module 108. A resource that indicates a logical pin is represented by a combination of three things: a resource type, a number that specifies the pin 128 in the module 108 (resource ID), and a port number of a bus 107 that specifies the module 108 in the test system 100. Since a relationship between a combination of a resource type and a resource ID and the corresponding physical pin 128 in the module 108 is fixed, it is possible to associate a resource with the physical pin 128 when the resource is provided. Association of a resource with the physical pin 128 is not architecturally necessary, and it is possible to represent functionality that the module 108 has as a virtual pin and control it.

Figure 3:
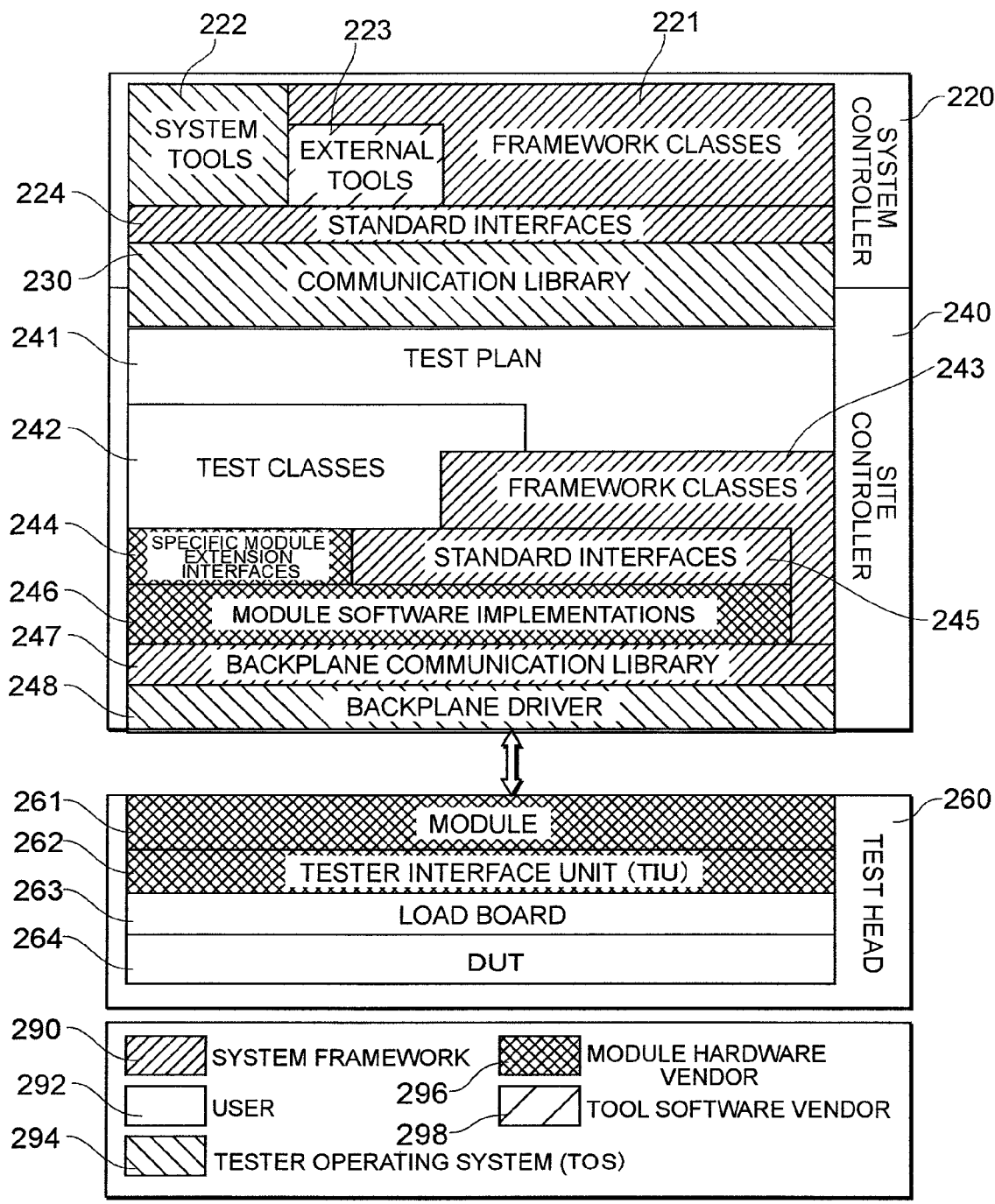
FIG. 3 is a diagram showing one example of software architecture 200 of the test system 100.

FIG. 3 shows one example of software architecture 200 of the test system 100. The software architecture 200 represents a distributed operating system and comprises components for system controller software 220 (hereinafter also referred to as just a "system controller 220"), at least one site controller software 240 (hereinafter also referred to as just a "site controller 240"), and test head software 260 (hereinafter also referred to as just a "test head 260") including at least one module, which correspond to the relevant hardware system components 102, 104 and 108.

As one exemplary choice, the test system 100 can use Microsoft Windows® as a software platform and ANSI/ISO Standard C++ as an implementation language. All system interfaces of the platform are also provided as classes or interfaces of C++, and user's test program and module software can be implemented in C++.

The system controller 220 is a primary interaction point for a user, and provides a gateway to the site controller 240 and synchronization between the site controllers 240 in a multi-site/DUT environment. A user application and a tool, whether they are based on a graphical user interface (GUI) or not, are run on the system controller 220.

Also, the system controller 220 plays a role of a repository for all test plan-related information including test plan, test pattern and test parameter files. A memory for memorizing these files may exist locally to the system controller 220 or connect to the system controller 220 via a network.

The system controller 220 further comprises framework classes 221, system tools 222, external tools 223, standard interfaces 224 to the site controller, and a communication library 230.

The framework classes 221 relevant to the system controller 220 provide a mechanism for interacting with objects, and provide reference implementations of the standard interfaces 224. Also, the framework classes 221 provide a gateway to the site controller 240, and configure a software component that provides synchronization between the site controllers 240 in a multi-site/DUT environment. Effectively, the framework classes 221 can play a role of an OS that supports the system controller 220.

A third-party developer can provide one or more of the tools 223 in addition to or instead of the standard system tools 222. The standard interfaces 224 on the system controller 220 include interfaces that those tools use for accessing testers and test objects. With the tools (applications) 222 and 223, testers and test objects can be controlled interactively as well as in a batch manner. Also, the standard interfaces 224 include open interfaces to framework objects run on the system controller 220, interfaces that allow module software based on the site controller 240 to access and search pattern data, etc.

The communication library 230 that exists on the system controller 220 provides a mechanism for communicating with the site controller 240 transparently to a user application and a test program.

The site controller 240 provides a large part of testing functionality. The site controller 240 includes a test plan (test program) 241, test classes 242, site controller framework classes 243, specific module extension interfaces 244, standard interfaces 245, module software implementations 246, a backplane communication library 247 and a backplane driver 248.

The test plan 241 is written by a user. The test plan program can be directly written in a standard computer language by using object-oriented components such as C++, or written in a higher level test programming language for generating C++ codes and then compiled to an executable test program.

The test plan 241 creates test objects by using the standard or user-supplied test classes 242 and/or the framework classes 243 relevant to the site controller 240 thereof, configures hardware using standard interfaces 245, and defines a test plan flow. The test plan supports some basic services, provides interfaces to the services of the lower-layer objects such as a debug service (for example, break point generation), and enables access to the lower-layer frameworks and standard classes.

The test classes 242 are one implementation of standard test interfaces and designated in a test plan program. Each of the test classes usually implements a certain type of a device test or settings for a device test.

The framework classes 243 are a set of classes and methods that implement common test-related operations. The framework classes 243 can effectively play a role of a local OS that supports each site controller 240.

The module software is preferably in a DLL (Dynamic Link Library) format so as to be dynamically loaded into a process of the test system 100 as needed when performing a test. This is because the test system 100 determines the module 261 that is to be controlled dynamically at runtime based on a configuration of the test site 110 designated by the test plan 241. Also, all of the module software is required to implement the standard interfaces 245 of the module software defined by a system OS based on the functionality of the module 261.

The specific module extension interfaces 244 implement, as needed, an interface layer that has module-specific, more complicated and specialized functionality in addition to the module software. For example, in C++, by defining interface classes that inherit the standard interfaces 245 in the module software, the interfaces can be extended.

The standard interfaces 245 are minimum, general, and universally-applicable interfaces defined by a system framework. Using the standard interfaces 245, all objects can be uniformly treated. This enables the software of a new module to be seamlessly introduced into a system in a plug-and-play manner without modifying a system OS.

As one example, the standard interfaces 245 are defined as pure virtual interface classes of C++. In this case, the standard interfaces 245 are preferably composed of the subclasses that define functionality for users, the subclasses that define functionality used by a system only, and the subclasses that define functionality of a resource. Also, layers of the standard interfaces 245 are preferably composed of four layers: the layer that defines the most basic functionality of a module, the layer that represents a module that has functionality of running a pattern program, the layer that introduces a concept of a test cycle shared among a plurality of pins, and the layer that adds functionality unique to a digital module. In this case, each module driver implements one of the four layers of interfaces depending on the function of a module. However, a configuration of the standard interfaces 245 is not limited to these configurations.

The backplane communication library 247 provides interfaces for standard communication across a backplane, and thereby provides functionality necessary to communicate with the module 108 in the test head 260. This enables vendor-specific module software to communicate with the corresponding module 108 using the backplane driver 248. A backplane communication protocol may use a packet-based format.

The test head 260 provides measuring functionality for a device. The test head 260 comprises a module 261, a TIU 262, a load board 263 and a DUT 264.

Also, based on a nominal source of software, components of the software architecture 200 can be categorized into a system framework 290, a user component 292, a tester operating system 294, a module hardware vendor component 296 and a tool software vendor component 298.

The system framework 290 is supplied by a development vendor of the test system 100 and includes the framework classes 221, the standard interfaces 224, the framework classes 243, the standard interfaces 245 and the backplane communication library 247.

The user component 292 is supplied by a user who performs a test and includes the test plan 241, the test classes 242, the load board 263 and the DUT 264.

The tester operating system 294 is supplied as a software infrastructure for basic connectivity and communication and includes the system tools 222, the communication library 230 and the backplane driver 248.

The module hardware vendor component 296 is supplied by a developer of the module 108 and includes the specific module extension interfaces 244, the module software implementations 246, the module 261 and the TIU 262.

The tool software vendor component 298 is supplied by a developer of an external tool and includes the external tools 223.

Next, back annotation processing in the test system 100 configured as above will be described. Here, back annotation means a function of reflecting modification details of a test plan, pattern data, etc. that are debugged using a GUI tool (the tools 222 and 223), etc. in a source file of the test plan, the pattern dada, etc. Back annotation is different from the debugging that is performed by a general-purpose debugger by directly opening a source code. When using a general-purpose debugger, since a program is debugged by directly opening a source, a result of debugging can be reflected by simply saving the source. On the other hand, when using back annotation, a target of debugging is data, and a tool for debugging is provided for each data, instead of directly modifying an original source.

For example, when developing a test plan, a user uses a GUI tool, etc. to debug and modify a test plan flow, test conditions, pattern data, etc. When a back annotation function is not used, modifications of various parameters have to be manually reflected in a source file of a test plan and pattern data. On the other hand, when a back annotation function is used, modification details of parameters can be automatically reflected and saved in a source file of a test plan and pattern data. Then, by compiling and loading the saved source file, a test plan in which a debug result is reflected can be run. When a back annotation function of the present embodiment is used, a comment that is written in a source file and a parameter value that cannot be modified by a GUI tool are retained as they were before modification. Modification details may include adding, deleting, changing execution order, etc. of a value of a user variable, a specification set, a test condition, setting of a resource parameter, setting of timing, a flow item, test details, etc.

Also, in back annotation of pattern data, modification details of a pattern program debugged by using a pattern editor are reflected in a metafile of pattern objects. For example, when developing a pattern program, a user uses a pattern editor to modify and debug a pattern program loaded into a pattern generator. When back annotation is not used, modifications of a pattern program must be manually reflected in a source file of a pattern program, and in order to obtain a metafile of debugged pattern objects, it is further needed to compile a modified pattern source file. On the other hand, when back annotation is used, a debugged pattern program can be saved in a metafile of pattern objects. By reloading the saved metafile of pattern objects, a pattern program in which a debug result is reflected can be run.

While a turn around time in developing a test plan and a pattern program can be reduced by using back annotation, the present invention particularly has a feature in back annotation processing of a test plan. That is, when a user modifies runtime objects of a loaded test plan, modified information is reflected and then saved in a source written in a test plan language by a back annotation function.

Methods to achieve back annotation can be categorized into a new source saving method, a difference saving method and an original source saving method. The new source saving method newly generates and saves objects of a test plan as a file that describes a new test plan, but comments, margins, orders, etc. in an original source file will be lost. The difference saving method saves differences of modifications added to running runtime objects. In this method, in order to obtain a modified test plan, an original test plan must be loaded in accordance with differences of modifications. In the original source saving method, modifications are added to an original source file. In this method, comments and margins are retained. The present invention achieves back annotation based on the original source saving method.

Back annotation processing of the present invention will now be described.

Figure 4:
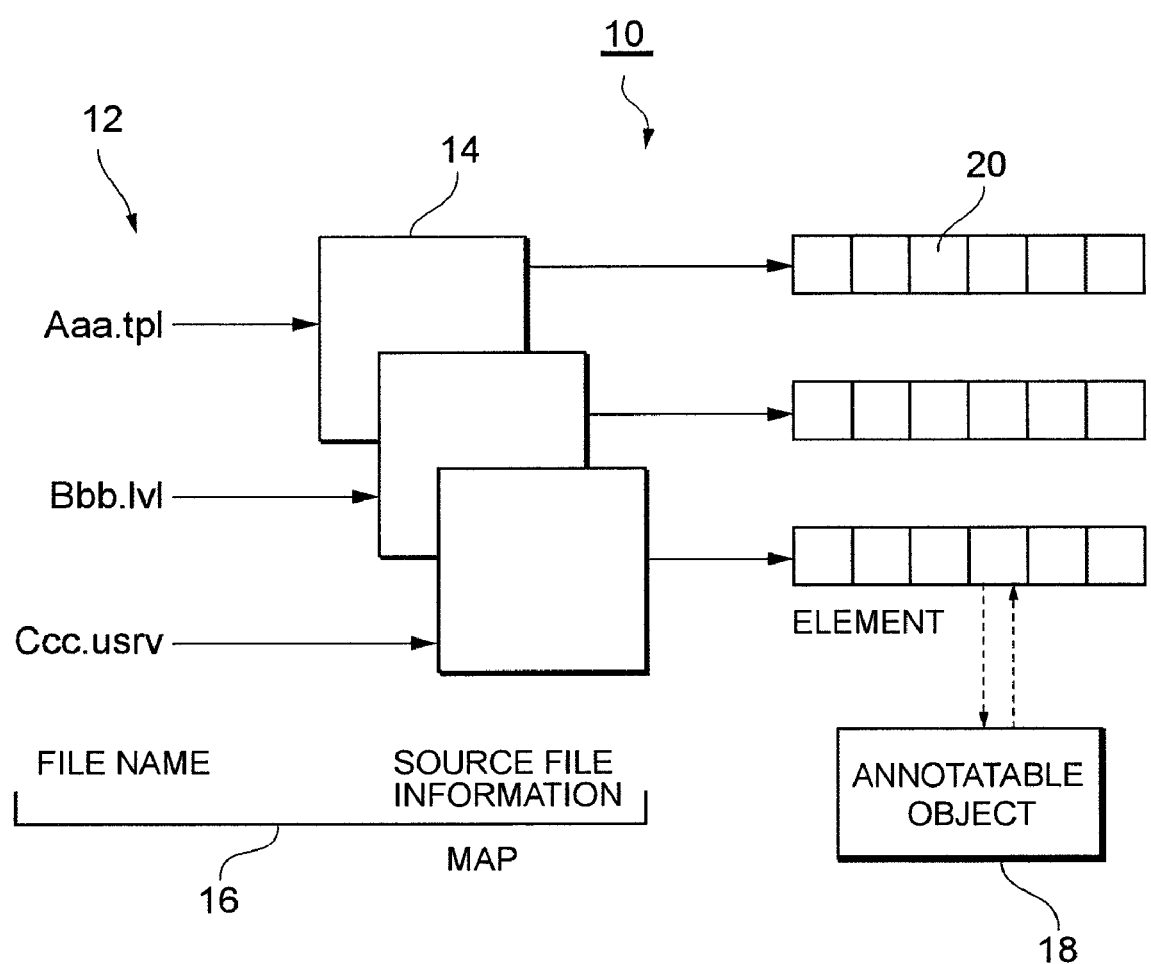
FIG. 4 is a diagram showing a data structure for performing back annotation processing of a test plan.

FIG. 4 is a diagram showing a data structure for performing back annotation processing of a test plan in the present test system 100. As shown in FIG. 4, a data structure 10 of back annotation processing includes a map 16 that maps each source file name 12 and its source file information 14 that constitute a test plan. Each source file information 14 is associated with a list of elements 20 that divide a source file in a predetermined unit. When a runtime object of a test plan is modified, an annotatable object 18 associated with an element 20 that corresponds to the modified portion is formed, and the modified details are managed. A test plan comprises one or more source files, and a program for performing a test is written in each source file.

The data structure 10 is generated by a user invoking a file save operation that starts a back annotation task.

The source file name 12 is a name of a source file of a test plan loaded into a system. In the present test system 100, the site controller 104 loads a test plan, and the data structure 10 for performing back annotation is constructed on the site controller 104.

The source file information 14 includes information about the corresponding source file name 12, a network file path, and a list of the associated elements 20. This allows it to be associated with one or more source file names 12 constituting a test plan as well as manage a set of the elements 20 corresponding to that source file. This list of the elements 20 is composed of pointers to the elements 20. Thus, objects in a test plan have pointers to elements in which the objects were declared. Since these pointers must not be nullified even when an element is inserted or deleted, they are controlled while the element 20 exists.

The map 16 indicates a mapping between one or more source file names 12 associated with a test plan loaded into a system and the source file information 14 of that source file.

The annotatable object 18 is an object that corresponds one-to-one to each element 20. An annotatable class is provided in pairs with a framework class, and an object is created on a block basis. When data is modified by debugging, details of that modification are managed and an operation necessary to perform back annotation is identified. This operation determines whether the object is modified or not, and if the object is modified, puts a predetermined mark on the element 20 that indicates that modification is performed, represents a text of the element 20 based on the modification details, etc. Also, the annotatable object 18 provides an implementation of a method for representing a text of the element 20 if needed. When back annotation is performed, latest data is obtained from a framework class and text data for writing back to a source file is created.

The element 20 is formed in a unit that divides a source file of a test plan into one or more blocks and associated with the source file information 14 that manages a write position of a program, etc. This allows a source file to be represented as a list of the consecutive elements 20. The element 20 is created for each block constituting a source file or each element written in a block, and if corresponding data is modified, the element 20 indicates where on a source file that modification details should be written back. In the present embodiment, separation of a block which is a unit in which the element is formed is determined based on a delimiter such as ";", "}", etc. written in a source file. Information about declarations in a source file is captured, and a simple object declaration without nesting is represented as one element 20. Also, an object declaration having a nested declaration is represented as the element 20 having a header or footer within one element. The element 20 comprises, for example, a name of a declared object, an item text length, and a pointer to the annotatable object 18. In back annotation processing, when a test plan is modified by debugging, a source file is modified on an element basis.

Figure 5:
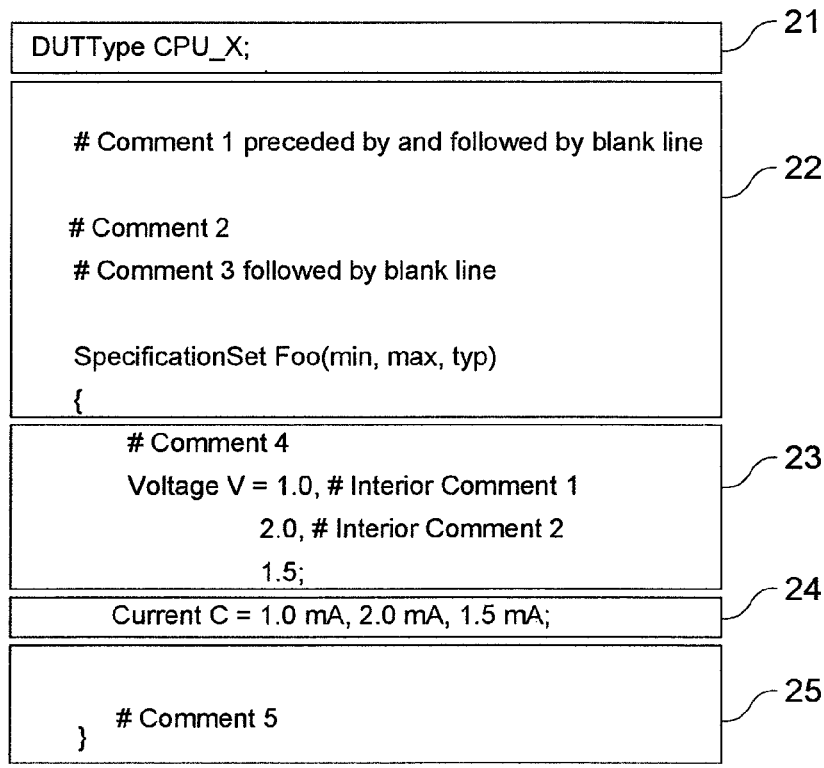
FIG. 5 is a diagram showing one example of elements 20.

FIG. 5 is a diagram showing one example of the element 20. FIG. 5A is one example of a source file of a test plan. FIG. 5B is a diagram showing the elements 20 that are formed based on a source file shown in FIG. 5A.

As shown in FIG. 5B, a source file in this example is divided into five elements 21, 22, 23, 24 and 25. The element 21 is an element related to a declaration of DUTType. The element 22 is an element related to a declaration of SpecificationSet. The element 23 is an element related to a declaration of Voltage. The element 24 is an element related to a declaration of Current. The element 25 is a trailer element of the declaration of SpecificationSet.

When a source file includes a comment and a line feed, an element is not usually created for these comment and line feed only. A comment, a line feed, etc. are associated with an element related a subsequent declaration. For example, as shown in the element 22, comments and line feeds are configured as a header of an element. Also, the element 22 is never configured in a nested manner. An object having a nested declaration is represented as a header or footer of an element.

Even if one of the elements 20 is modified, a comment and a line feed thereof are retained. For example, even if the SpecificationSet in the element 22 is modified, comments 1 to 3 in the element 22 do not change. Similarly, even if the value of the Voltage V in the element 23 is modified from 1.0 to 1.1, a comment 4 in the element 23 does not change.

However, if the value of the Voltage V in the element 23 is modified from 1.0 to 1.1, interior comments 1 and 2 are not retained but destroyed. And the declaration of the Voltage V in the element 23 is written back to a source file and modified as follows.

Voltage V=1.1, 2.0, 1.5;

A comment in a source file is associated with an element subsequent to that comment. And a comment at the same grammar level as an element is retained. However, a comment at a nested level against a declaration, that is, the interior comment 1 and the interior comment 2 in the element 23, for example, are not retained when representation is modified. Also, if there is a comment after a trailing semicolon of each element, that comment will be included in the next element. Also, the element 20 preferably comprises a name of a file.

Figure 6:
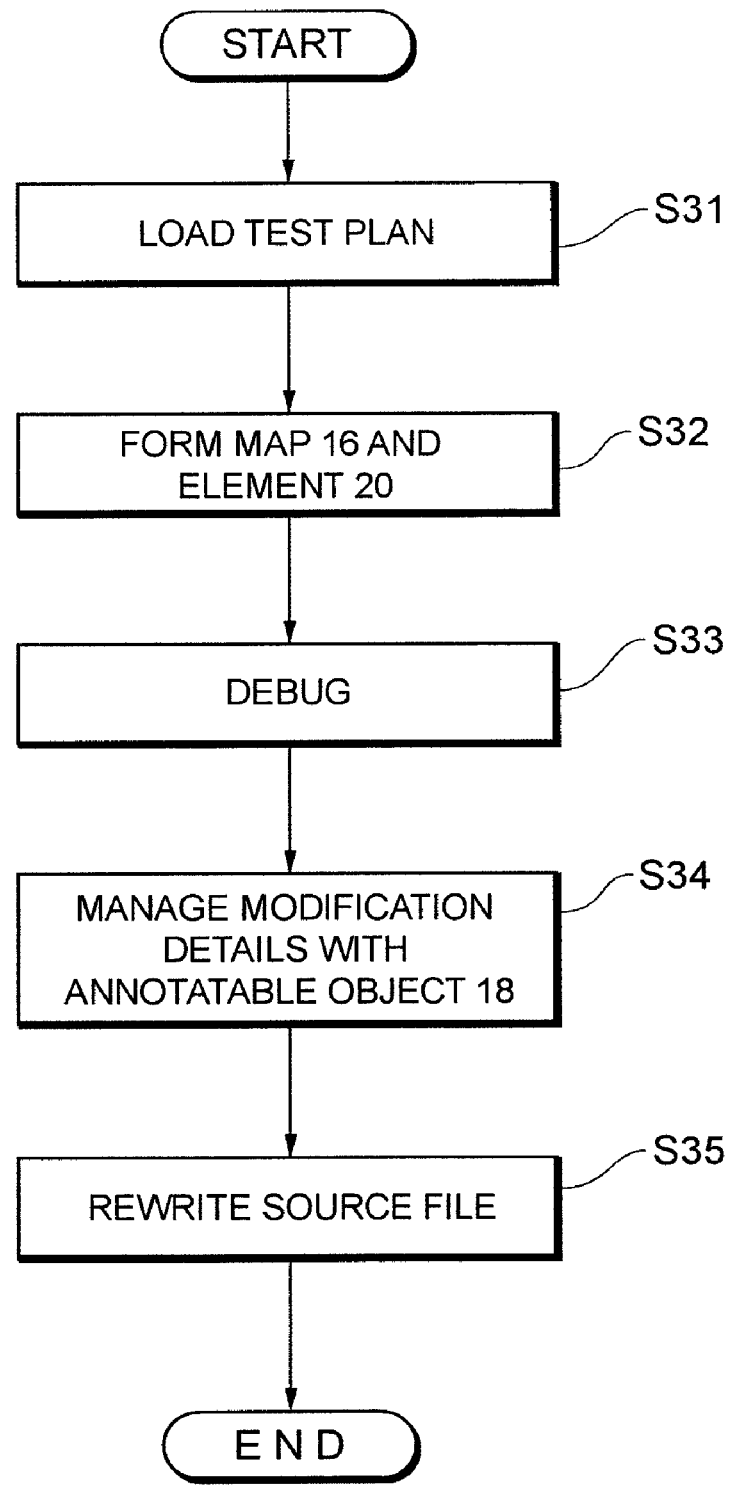
FIG. 6 is a flowchart showing a flow of back annotation processing.

FIG. 6 is a flowchart showing a flow of back annotation processing when a test plan is debugged in the test system 100.

First, a test plan is loaded on the site controller 104 (S31). At this point, for each block of a source file, a framework class for managing data described in that block is provided. For example, in order to manage description details of a UserVars block, an object of a UserVars class which is one of the framework classes is created. If a user is invoking a file save operation that starts a back annotation task, codes are generated when a test plan is loaded, and the map 16 from the source file name 12 to the source file information 14 is formed. Also, a series of the elements 20 associated with the source file information 14 are generated (S32). Objects of a loaded test plan include the map 16 and pointers to the corresponding elements 20.

At this point, a user debugs a test plan and a pattern data using a GUI tool (S33). In this debugging that uses a GUI tool, if data is modified by editing, deleting or newly inserting data, details of that modification are managed in the annotatable object 18 corresponding to a modified portion (S34).

For example, when an object is edited by, for example, modifying an initial value of a user variable, an element indicating an edited portion is put a mark that indicates that it was edited. Also, when data is deleted, an element corresponding to a deleted portion is put a mark that indicates that it was deleted. At this point, a comment associated with that element is also deleted. When data is newly inserted, the element 20 corresponding to the newly inserted data is newly generated, and data related to a newly inserted object is managed in that element 20.

Then, when back annotation is requested after debugging, the modified portion is identified by the element 20, and a text at the position in a source file indicated by the element 20 is rewritten with modified text data obtained from the annotatable object 18 (S35). For example, for the element 20 on which the mark indicating that it was edited is put, a source file is rewritten based on a content of the annotatable object 18. At this point, a comment, etc. in a source file are not rewritten but retained. A source file that is to be generated is generated from test plan objects using a language module.

If a test plan is not modified, such as if debugging of a test plan is completed and a test of the DUT 112 is actually performed, the process of generating the element 20, etc. as shown in the step S32 is not necessary when a test plan is loaded.

Also, a back annotation function can be used both when a test program is loaded from a test plan DLL and when a test program is loaded directly from a source file using a test plan loader.

The present invention is not limited to the above embodiments and can be embodied in other various forms without departing from the gist thereof. Thus, the above embodiments are merely exemplary in all respects and should not be construed as restrictive. For example, each of the above described processing steps may be performed in any order or in parallel as long as no inconsistency arises in processing details.

What is claimed is:

1. A test system for performing a test of a device, the test system comprising:
a source file of a test plan that describes a program for performing a test;

one or more elements that are formed in a unit that divides the source file into one or more blocks;

an annotatable object that, when debugging of objects of the source file is performed, manages modification details of the debugging with reference to an element corresponding to a portion where the debugging is performed; and a controller that, after debugging, rewrites the source file with details after the debugging is performed on an element basis based on the element and the annotatable object.

2. The test system according to claim 1, wherein the test plan comprises one or more source files, and the one or more elements are created for each of the one or more source files.

3. The test system according to claim 2, wherein the test system comprises:

source file information that that is associated with each file name of the one or more source files and manages a series of elements that correspond to that source file.

4. The test system according to claim 1, wherein separation of a block which is a unit in which the one or more elements are formed is determined based on a delimiter written in the source file.

5. The test system according to claim 1, wherein the debugging is performed using a GUI tool.

6. A method of performing back annotation processing for reflecting modification details of debugging in an original source file in a test system for performing a test of a device, a controller of the test system comprising the steps of:

loading a source file of a test plan that describes a program for performing a test;

forming, after the loading, one or more elements in a unit that divides the source file into one or more blocks;

managing, when debugging of objects of the source file is performed, modification details of the debugging with an annotatable object that is associated with an element corresponding to a portion where the debugging is performed; and rewriting, after debugging, the source file with details after the debugging is performed on a the element basis based on the element and the annotatable object.

7. A computer-readable recording medium in which is stored a program for making a computer perform the back annotation method according to claim 6.

* * * * *